US007875351B2

(12) United States Patent
Alivisatos et al.

(10) Patent No.: US 7,875,351 B2
(45) Date of Patent: Jan. 25, 2011

(54) NANOREACTORS COMPRISING A NANOREACTOR SHELL ENVELOPING A SPACE, AND METHOD OF MAKING

(75) Inventors: A. Paul Alivisatos, Oakland, CA (US); Yadong Yin, Moreno Valley, CA (US); Robert M. Rioux, Somerville, MA (US); Gabor A. Somorjai, Berkeley, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 10/599,250

(22) PCT Filed: Mar. 22, 2005

(86) PCT No.: PCT/US2005/009333

§ 371 (c)(1),
(2), (4) Date: Sep. 22, 2006

(87) PCT Pub. No.: WO2006/033666

PCT Pub. Date: Mar. 30, 2006

(65) Prior Publication Data

US 2008/0226934 A1  Sep. 18, 2008

Related U.S. Application Data

(60) Provisional application No. 60/555,590, filed on Mar. 22, 2004.

(51) Int. Cl.
*B32B 5/16* (2006.01)

(52) U.S. Cl. ..................... 428/403; 977/773
(58) Field of Classification Search ............... 428/403; 977/773
See application file for complete search history.

(56) References Cited

U.S. PATENT DOCUMENTS

| 6,833,192 | B1 | 12/2004 | Caruso et al. |
| 7,029,514 | B1 * | 4/2006 | Yang et al. .................... 75/348 |
| 7,381,465 | B2 * | 6/2008 | Torimoto et al. ............ 428/403 |
| 7,601,670 | B2 * | 10/2009 | Yasuda et al. ............... 502/326 |
| 7,632,601 | B2 * | 12/2009 | Adzic et al. .................. 429/44 |
| 2002/0002794 | A1 | 1/2002 | Figueroa et al. |
| 2002/0012624 | A1 | 1/2002 | Figueroa et al. |

OTHER PUBLICATIONS

Pal et al., "Synthesis of metal-cadmium sulfide nanocomposites using jingle-bell-shaped core-shell photocatalyst particles", Journal of Applied Electrochemistry (2005) 35:751-756.*
Flynn et al, Synthesis and characterization of molybdate-modified platinum nanoparticles, Phys. Chem., Chem. Phys., 2004, 6, 1310-1315, available online Feb. 11, 2004.*

(Continued)

*Primary Examiner*—H. (Holly) T Le
(74) *Attorney, Agent, or Firm*—Michelle Chew Wong; Lawrence Berkleley National Laboratory

(57) ABSTRACT

Described herein are nanoreactors having various shapes that can be produced by a simple chemical process. The nanoreactors described herein may have a shell as thin as 0.5 nm and outside diameters that can be controlled by the process of making and have a nanoparticle enclosed therein. The nanoreactors have catalytic activity and may be used to catalyze a variety of chemical reactions.

31 Claims, 1 Drawing Sheet

OTHER PUBLICATIONS

Gao et al., Multifunctional Yolk-Shell Nanoparticles: A Potential MRI Contrast and Anticancer Agent, J. Am. Chem. Soc. 2008, 130, 11825-11833; available online Aug. 6, 2008.*

Aldinger, "Controlled Porosity by an Extreme Kirkendall Effect", Acta Metallurgica, vol. 22, p. 923-928, (Jul. 1974).

Barrett et al., "The Determination of Pore volume and Area Distributions in Porous Substances", Journal of the American Chemical Society, vol. 73, p. 373-380, (Jan. 1951).

Brunauer et al., "Adsorption of Gases in Multimolecular Layers", Journal of the American Chemical Society, vol. 60, p. 309-319, (Feb. 1938).

Caruso et al., "Nanoengineering of Inorganic and Hybrid Hollow Spheres by Colloidal Templating", Science, vol. 282, p. 1111-1114, (Nov. 6, 1998).

Cortright et al., "Kinetic Study of Ethylene Hydrogenation", Journal of Catalysis, vol. 127, p. 342-353, (1991).

Grunes et al., "Ethylene Hydrogenation over Platinum Nanoparticle Array Model Catalysts Fabricated by . . . ", Journal of Physical Chemistry, vol. 106, p. 11463-11468, (2002).

Liang et al., "Pt Hollow Nanospheres: Facile Synthesis and Enhanced Electrocatalysts", Angewandte Chemie International Edition, vol. 43, p. 1540-1543, (2004).

Dietz, "Response Factors for Gas Chromatographic Analyses", Journal of Gas Chromatography, vol. 5, p. 68-71, (1967).

Matyi et al., "Particle Size, Particle Size Distribution, and Related Measurments of Supported . . . ", Catalysis Reviews: Science and Engineering, vol. 29, p. 41-99, (1987).

Mrowec et al., "Sulphidation of Cobalt at High Temperatures", Journal of Materials Sciences, vol. 33, p. 2617-2628, (1998).

Puntes et al., "Synthesis of hcp-Co Nanodisks", Journal of the American Chemical Society, vol. 124 (No. 43), p. 12874-12880, (2002).

Rondeau, "Slush Baths", Journal of Chemical and Engineering Data, vol. 11, p. 124, (1966).

Schlatter et al., "Hydrogenation of Ethylene on Supported Platinum", Journal of Catalysis, vol. 24, p. 482-492, (1972).

Sobal et al., "Synthesis of Core-Shell PtCo Nanocrystals", Journal of Physical Chemistry B, vol. 107, p. 7351-7354, (2003).

Song et al., "Pt Nanocrystals: Shape Control and Langmuir-Blodgett Monolayer Formation", Journal of Physical Chemistry B, vol. 109, p. 188-193, (2005).

Sun et al., "Shape-Controlled Synthesis of Gold and Silver Nanoparticles", Science, vol. 298, p. 2176-2179, (Dec. 13, 2002).

Torimoto et al., "Preparation of Novel Silica-Cadmium Sulfide Composite Nanoparticles Having . . . ", Journal of the American Chemical Society, vol. 125, p. 316-317, (2003).

Yin et al., "Formation of Hollow Nanoparticles Through the Nanoscale Kirkendall Effect", Science, vol. 204, p. 711-714, (Apr. 30, 2004).

Zaera et al., "Hydrogenation of Ethylene over Platinum (111) Single-Crystal Surfaces", Journal of the American Chemical Society, vol. 106, p. 2288-2293, (1984).

Smigelskas et al., "Zinc Diffusion in Alpha Brass," American Institute of Mining Engineers Transactions, vol. 171, pp. 130-142, (Atlantic City Meeting), (Nov. 1946).

Torimoto et al., "Influences of Initial Particle Size on Preparation of Monodiperse CdS Nanoparticles with Size-Selective Photoetching," Chemistry Letters, The Chemical Society of Japan, pp. 379-380, (1999).

Torimoto et al., "Characteristic Features of Size-Selective Photoetching CdS Nanoparticles as a Means of Preparation of Monodisperse Particles," Journal of the Electrochemical Society, vol. 145, No. 6, pp. 1964-1968, (Jun. 6, 1998).

Torimoto et al., "Characterization of Ultrasmall CdS Nanoparticles Prepared by the Size-Selective Photoetching Technique," The Journal of Physical Chemistry B, vol. 105, No. 29, pp. 6838-6845, Jun. 20, 2001).

* cited by examiner

NANOREACTORS COMPRISING A NANOREACTOR SHELL ENVELOPING A SPACE, AND METHOD OF MAKING

PRIORITY

This application claims priority to U.S. Provisional application 60/555,590, filed Mar. 22, 2004, and to International Application PCT/US04/33581, filed Oct. 11, 2004, the contents of which are both incorporated herein by reference for all purposes.

STATEMENT AS TO RIGHTS TO INVENTIONS MADE UNDER FEDERALLY SPONSORED RESEARCH OR DEVELOPMENT

The invention described and claimed herein was made in part utilizing funds supplied by the United States Department of Energy under contract NO. DE-AC03-76SF000-98 between the United States Department of Energy and The Regents of the University of California. The government has certain rights to the invention.

BACKGROUND OF THE INVENTION

Porous solid materials are important in many areas of modern science and technology, including ion exchange, molecular separation, catalysis, chromatography, microelectronics, and energy storage. Notable examples are microporous (<2 nm) zeolites and mesoporous (2-50 nm) silicate and carbonaceous materials. The ability to manipulate the structure and morphology of porous solids on a nanometer scale would enable greater control of chemical reactions.

It is known that porosity may result from differential solid-state diffusion rates of the reactants in an alloying or oxidation reaction. Previous studies on the interdiffusion of 30-micrometer powders with layered composition showed significant porosity, but the geometry and distribution of the pores were not uniform, probably due to aggregation and still bulk-like dimension of the particles. Recently, significant progress has been made in synthesizing colloidal nanocrystals with well-controlled size, shape and surface properties. This invention discloses the production of a uniform population of nanoreactors by employing such high-quality nanocrystals as the starting materials.

Hollow particles of silica have been made with diameters between 720 and 1000 nm, see *Science*, Vol 282, Issue 5391, 1111-1114, 6 Nov. 1998, the contents of which are hereby incorporated by reference in its entirety for all purposes.

Gold single crystalline nanoboxes have been made, though not on the nanoscale size dimension as taught by the present invention, see Y. Sun, Y. Xia, *Science* 298, 2176 (2002), the contents of which are hereby incorporated herein in its entirety for all purposes.

SUMMARY OF THE INVENTION

This invention discloses the production of a uniform population of nanoreactors. The nanoreactors comprise a nanoreactor shell having a thickness of at least 0.5 nm, and the nanoreactor shell envelops or encages a space. The nanoreactor shell is not perfectly single crystalline and a nanoparticle disposed within the space.

Also disclosed is a method of making a nanoreactor, comprising providing a nanoparticle, coating the nanoparticle with a first material, reacting the first material with a second material, wherein the first and second material react to form a nanoreactor shell encaging the nanoparticle. In one embodiment, the diffusion rate for the first material is different than the diffusion rate for the second material.

DETAILED DESCRIPTION OF THE PREFERRED EMBODIMENTS

Figure 1:
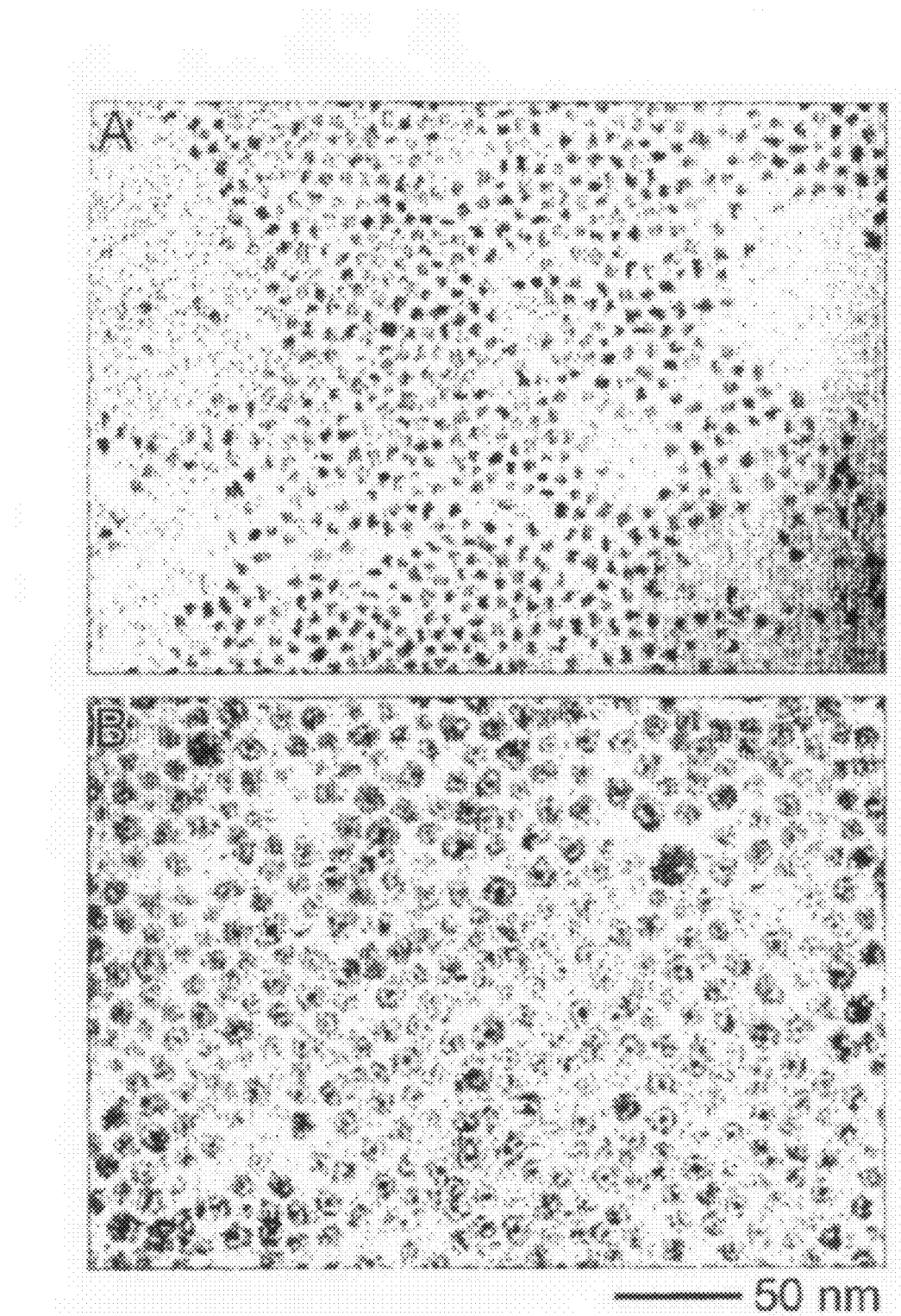
FIG. 1A Pt nanoparticles prepared in accordance with this invention.
FIG. 1B Pt@CoO nanoreactors formed in accordance with one embodiment of the present invention.

By "providing a nanocrystal or nanoparticle" it is meant any step, process or manipulation that produces a nanocrystal or nanoparticle capable of entering into a reaction or process. Typically this step is synthetic, and the nanocrystals or particles are in solution after synthesis. This step may be accomplished by purchasing commercially available nanocrystals or nanoparticles.

By "bulk" or "bulk systems" it is meant materials not on the nanoscale size dimension.

By "disk shaped" or "disk" it is meant a relatively cylindrical structure having size dimensions as defined herein.

By "tube shaped" or "tubular" and "tube(s)" it is meant a structure that has a hollow cylindrical shape. The cylinder is not required to be uniform in diameter. It is understood that the tube has two ends that are closed. However, during synthesis it is possible for the ends to become open by accidental fracture.

By "nanoreactor" it is meant to include all shapes, including spheres, disks, tubes, tetrapods, branched and unbranched nanocrystals. As used herein, a particle enclosed in a nanocrystal shell is termed a "nanoreactor" a "nanocatalyst" a "nanosphere", "yolk/shell" and also "Pt@CoO" or Pt/CoO (note: Pt and CoO are only non-limited examples of materials).

By "preliminary main material" as recited herein it is meant the first material, also termed the main starting material, not the nanoparticle such as Pt, in the present invention, which is an element, a compound or a composition that is coated over the nanoparticle. This material reacts to form a nanocrystal shell with a space around the nanoparticle enclosed therein.

By "reaction" it is meant to include not only chemical reactions, but also alloy formation.

By "not perfectly single crystalline" it is meant that there are at least grain boundaries or other defects in the nanoreactor shell.

By "envelop" it is meant to enclose completely with or as if with a covering. This definition allows for the presence of grain boundaries due to polycrystalline materials.

By "Pt@CoO" or "Pt/CoO" it is meant Pt particles in a CoO shell, where there is space between the inside particle and the inside wall of the shell. It is understood that the CoO shell is only one non-limiting example of the material contemplated for the shell, as well as Pt particles as non limiting examples for the nanoparticle enclosed within the shell. The term "yolk/shell" refers to a CoO shell and a Pt yolk in this instance.

The nanoreactors produced in accordance with the present invention have outside diameters of between about 1 nm-1000 nm. In a preferred embodiment the nanoreactor have outside diameters of between 1 nm-500 nm and more preferred is about 5 nm-100 nm, even more preferred are 10 nm-50 nm, and even more preferred are 10 nm-30 nm. In one embodiment nanotubes have outside diameters of between about 1 nm-1000 nm, preferably between 5 nm-500 nm, and more preferably between about 10 nm-250 nm, and even more preferably between 10 nm-100 nm. The length of the nanotubes used as nanoreactors herein in accordance with the present invention ranges from about 30 nm to 500 µm, preferably between about 30 nm-250 µm and more preferably between about 50 nm and 200 µm, even more preferably between 50 nm-20 µm. In one embodiment nanoreactors with a disk shape have diameters between 10 nm-200 nm, preferably between about 10 nm-100 nm and more preferably about 25 nm-50 nm. In one embodiment the thickness of the disk is between about 1 nm-20 nm, preferably between 2 nm-15 nm and more preferably between 3 nm-10 nm.

The ratio of the inside diameter (id) to the outside diameter (od) for nanoreactors, expressed (id)/(od), ranges from between 20-90%. As a non-limiting example CoO and CoS nanospheres made in accordance with this invention have a ratio of about 40%.

The present invention contemplates that the thickness of the nanoreactor wall is controllable by varying the temperature of the reaction and the concentration of the material that reacts with the preliminary main material to form the nanocrystal shell of the nanoreactor. In one embodiment of the invention the walls or shell of the nanoreactor have a thickness having a range between 0.5 nm and 100 nm, preferably between 2 nm-80 nm and more preferably between 3 nm-50 nm, even more preferably between about 3 nm and 10 nm. By varying the reaction temperature and concentration, the (id)/(od) for CoS may vary between 30%-40% (0.3-0.4). In a preferred embodiment of the method, it is preferable to control the (id)/(od) by varying the preliminary starting nanoreactor size.

It is understood that in accordance with this invention the shell of the nanoreactors from a continuous three dimensional domain adopting a three dimensional arrangement of atoms in contrast to molecular sheets such as found in graphitic, $WS_2$ or $MoS_2$ nanotubes and nanocages.

The crystallinity of the nanoreactor wall, or shell is controllable. In a preferred embodiment the shell is at least partially crystalline. The advantage of a polycrystalline shell is that the defective grain boundary will allow gasses and other chemical species made of small molecules to permeate. One skilled in the art will appreciate that annealing at relatively high temperatures will eliminate many grain boundaries. In one embodiment of the present invention the nanoreactors have an extremely low crystallinity, so as to be almost amorphous. The nanoreactors in the present invention have shell walls that are nanocrystals that are not perfectly single crystalline. In a preferred embodiment the nanoreactors are at least partially polycrystalline. In a more preferred embodiment they are between 10-100% polycrystalline, and in a more preferred embodiment they are between 50 and 100% polycrystalline, and in an even more preferred embodiment they are between 75 and 100% polycrystalline. The percentages as used herein refer to the total volume fraction of the crystalline grains in the nanoreactor excepting the largest crystalline grain.

In one embodiment of the present invention a nanoreactor is provided which may be used as a catalytic material. In one non-limiting embodiment a Pt@CoO nanoreactor is synthesized, in which a Pt nanoparticle of a few nanometers is encapsulated in a CoO shell. Generally, three steps are involved in the preparation of these nanoreactors: synthesis of nanoparticle seeds, in this embodiment Pt seeds are provided by a modified "polyol" process, as in N. S. Sobal, U. Ebels, H. Möhwald, M. Giersig, *J. Phys. Chem.* 107, 7351 (2003) the contents of which are hereby incorporated by reference in its entirety. The present invention contemplates that any metal, material or alloy capable of catalytic activity is useful. The size of the particles can be tuned from at least 0.5 to 20 nm, preferably 1-10 nm, more preferably 2-5 nm, typically depending on the concentration and choice of surfactants. Any shape particle may be used. Any particle made using other methods may also be used.

The second step involves deposition of a first material termed the preliminary main material herein, in one non limiting embodiment cobalt, on the nanoparticle, in this embodiment, Pt. In one embodiment this is accomplished by injecting $Co_2(CO)_8$ into a hot solution of nanoparticles and decomposed to form a conformal coating on Pt nanoparticles. Tertiarilly is the transformation of the preliminary main material, in this case, Co into CoO hollow structures. In one embodiment of the present invention this is accomplished by the following oxidation procedure. Oxidation of the Pt@Co nanocrystals is performed a few minutes after the introduction of cobalt carbonyl by blowing a stream of $O_2$/Ar (1:4 in volume ratio, 120 ml/min) mixture into the colloidal solution at 455 K. The system is kept under stirring for 3 hours. A black stable colloidal dispersion in o-dichlorobenzene is obtained. Finally, the Pt@CoO nanoreactors are precipitated by methanol, washed with toluene and methanol three times, and dried under vacuum. Typical nitrogen adsorption/desorption measurement on the powder at 77K shows a type IV isotherm with type H2 hysteresis, with a Brunauer-Emmet-Teller (BET) surface area of 65 $m^2/g$ and a total pore volume of 0.0676 $cm^3/g$. FIG. 1A shows a typical sample of Pt particles with an average diameter around 3 nm. The deposition of Co onto Pt at the reaction temperature yields no alloy, only Pt core/Co shell particles, as confirmed by XRD analyses. The oxidation reaction removes Co atoms away from the Pt particle surface, leading to the formation of a Pt yolk/CoO shell structure (FIG. 1B). No free platinum particles were found by TEM inspections on the Pt@CoO sample.

In one embodiment of the present invention, sulfidation of a preliminary main starting material such as cobalt results in formation of the nanoreactor shell. Cobalt sulfide shells are synthesized in one pot by injection of a solution of sulfur in o-dichlorobenzene into a hot Co capped nanoparticle. At 445 K, the reaction between cobalt and sulfur completes within a few seconds, resulting in a stable black solution of cobalt sulfide hollow nanocrystals with a nanoparticle enclosed therein.

During the reaction of the sulfur with the hot nanocrystal solution, outward flow of cobalt through the sulfide shell results in supersaturation of vacancies, which condense to form a single hole in each nanoparticle. Two stable cobalt sulfide phases are observed, linnaeite ($Co_3S_4$) and cobalt pentlandite ($Co_9S_8$), depending on the sulfur-to-cobalt molar ratio used in the synthesis. One having ordinary skill in the art will be able to adjust the sulfur-to-cobalt ration to arrive at the desired composition of linnaeite and pentlandite.

In one embodiment of the present invention, the outside starting nanocrystal shell material may be reacted with oxygen to produce oxide shell nanocrystals. In one nonlimiting embodiment, bulk cobalt, the rates of oxidation are 34 orders of magnitude lower than those of sulfidation above 750 K, see S. Mrowec, M. Danlelewski, A. Wojtowicz, *J. Mater. Sci.* 33, 2617 (1998), the contents of which are hereby incorporated by reference for all purposes.

In another embodiment of the present invention, the outside starting nanocrystal shell material may be reacted with selenium to produce shell nanocrystals, for example cobalt may be reacted with selenium. In bulk systems, annihilation of excess vacancies at dislocations and boundaries can produce stresses leading to the formation of cracks near the interface; the cracks then act as nuclei for the further condensation of supersaturated vacancies, see F. Aldinger, *Acta Met.* 22, 923 (1974), the contents of which are hereby incorporated by reference in its entirety for all purposes. While the exact mechanism is likely to be different, in nanocrystals voids also begin to develop and merge at the boundary. The high defect content and surface energy associated with the boundary favors the nucleation of voids there. Also, as vacancies diffuse inwards, they will be more concentrated at the boundary rather than in the interior of the core. As the reaction proceeds in time, more cobalt atoms diffuse out to the shell and the accompanying transport of vacancies leads to growth and merging of the initial voids. This results in the formation of bridges of material between the core and the shell that persist until the core is completely consumed. These bridges provide a fast transport path for outward diffusion of cobalt atoms which can then spread on the inner shell surface. A similar phenomenon was observed for bulk powders.

Disk shaped nanoreactors may be made in accordance with one embodiment of this invention, where the nanoparticle has a disk shape. The starting material or first nanocrystal must have a disk shape. Disk shaped particles may be made according to the prior art methods such as V. F. Puntes, D. Zanchet, C. K. Erdonmez, A. P. Alivisatos, *J. Am. Chem. Soc.* 124, 12874 (2002), the contents of which are hereby incorporated by reference in its entirety for all purposes.

The material used as a nanoparticle for the nanoreactor may be elemental or a compound, or an alloy. In a preferred embodiment the material used as a nanoparticle be elemental. Metals include the main group metals, Al, Ga, In, Tl, Sn, Pb, Bi and Po; the transition metals Sc, Ti, V, Cr, Mn, Fe, Co, Ni, Cu, Y, Zn, Zr, Nb, Mo, Tc, Ru, Rh, Pd, Ag, Cd, La, Hf, Ta, W, Re, Os, Ir, Pt, Au, Hg, the alkali and alkaline earth metals Li, Na, K, Rb, Cs, Be, Mg, Ca, Sr, Ba and the semiconductor metals Ge, Si, Se, Te. Compounds include, but are not limited to $Fe_2O_3$, $TiO_2$, CdS, CdSe and ZnS. Alloys include, but are not limited to FeCo, CoNi and CdZn. Preferred in Pt metal.

The material used as a preliminary main material for the outside shell of the nanoreactor may be elemental or an alloy. In a preferred embodiment the preliminary main material for the formation of nanoreactors be elemental. Metals include the main group metals, Al, Ga, In, Tl, Sn, Pb, Bi and Po; the transition metals Sc, Ti, V, Cr, Mn, Fe, Co, Ni, Cu, Y, Zn, Zr, Nb, Mo, Tc, Ru, Rh, Pd, Ag, Cd, La, Hf, Ta, W, Re, Os, Ir, Pt, Au, Hg, the alkali and alkaline earth metals Li, Na, K, Rb, Cs, Be, Mg, Ca, Sr, Ba and the semiconductor metals Ge, Si, Se, Te. Alloys include, but are not limited to FeCo, CoNi and CdZn. It would not be possible to obtain structures containing carbon as the major constituent material, but various carbon nanostructures, including diamond nanoparticles or carbon nanotubes may be utilized as the starting material and reacted with other species to obtain carbon-alloyed nanoreactors, for example nanospheres of steel may be synthesized by reacting a diamond nanospheres with a suitable iron source. This resulting structure will be chemically and crystallographically very different from sheet-like structures such as buckministerfullerenes or carbon nanotubes. Halogens and noble gases are not suitable. One having ordinary skill in the art will appreciate that the stability and reactivity of the preliminary main material in solution and under reaction conditions will impact on the success of the present method and the quality of the nanoshell derived therefrom. For example, alkali earth metals are less stable and would require more stringent reaction conditions for success.

The material chosen to react with the material used as a preliminary main material does not have to be elemental. It is only required that the material be capable of donating that element or compound of interest. As a non-limiting example, for the sulfidation of Co, all that is required is a compound capable of donating sulfur. One skilled in the art will readily appreciate without undue experimentation the compositions capable of donating sulfur in the reaction solution.

As non-limiting examples, nanoreactors in accordance with the present invention have shells that may comprise ZnS, ZnSe, ZnTe, ZnO and other oxides of the preliminary main materials such as CoO, $Co_3O_4$, $F_2O_3$, $TiO_2$ and $Al_2O_3$; Cd materials coated over a nanoparticle such as Pt may produce cadmium nanoshells such as CdS by sulfidation; other non-limiting examples of sulfur compounds include those of other metals including Ni, such as $Ni_5S_2$; other Ni compounds include $Ni_2Si$, NiSi and $NiCl_2$; other cadmium compounds include CdSe, CdTe, etc.; though difficult, Hg materials may produce HgS, HgSe, HgTe; other nanocrystals include MgTe and the like, GaN, GaP, GaAs, GaSb, InN, InP, InAs, InSb, AlAs, AlP, AlSb, AlS, and the like, $Co_9S_8$, $Co_3S_4$ and CoSe. Also included are ternary material systems such as GaMnAs, GaInN and InAsN.

In one embodiment the nanoreactor shell comprises a binary or ternary compound, wherein said binary and/or ternary compound comprises a first material and a second material, wherein the first material comprises a material selected from the group consisting of Pt, Zn, Co, Fe, Ti, Cd, Hg, Mg, Ga, In, Al, Ni, Sn and Bi; and the second material is selected from the group consisting of S, Se, O, P, N, F, Cl, I, Br, As and Sb.

In another embodiment the second material comprises a material chosen from the group consisting of S, O, Se, Te, P, N, As, Cl, I, Br and Bi.

In accordance with the present invention, the mobilities of the reacting species, the first material i.e. the preliminary main material and the second material are not necessarily chosen such that they are drastically different to result in vacancy transport. The invention contemplates that placing a nanoparticle having a coating comprising one reactant in a comparatively dilute solution creates an additional asymmetry that may favor the creation of nanospheres encaging a nanoparticle.

The present invention contemplates that the nanoreactors of the present invention may serve as heterogeneous catalysts. This invention contemplates platinum or other suitable inside nanoparticle can carry out hydrocarbon conversion reactions (which includes any reaction that includes a hydrocarbon as feedstock without any participation of the cobalt oxide shell. These reactions include hydrogenation, dehydrogenation of ethylene and cyclohexene. A preferred embodiment is the use of the nanoreactors disclosed in for the isomerization of hydrocarbons. By "hydrocarbons" it is meant to include $C_4$-$C_{3000}$, preferred is $C_4$-$C_{10}$. One advantage of the present nanoreactors over the prior art is that the separation of the nanoparticles by the nanocrystal shell prevents secondary reaction of the products that would change selectivity and desired product distribution. In other embodiment it is contemplated that at higher reaction temperatures, both the cobalt compound and the Pt nanoparticle inside the shell are active. In this circumstance, the reaction selectivity can be altered because Pt readily atomizes $H_2$ or $O_2$ to provide superior reducing or oxidizing power for the cobalt compound. Reactions of interest include CO hydrogenation, partial oxidation of light alkanes and hydrodesulfurization of thiophene. In a preferred embodiment the hydrodesulfurization of thiophene is carried out by contacting thiophene with the nanoreactors described herein during a hydrodesulfurization process. Hydrodesulfurization is known in the art and is heretofor catalyzed by other materials.

To demonstrate the efficiency of the nanoreactors described herein, Pt@CoO was chosen to exemplify a heterogeneous catalyst and the hydrogenation of ethylene was chosen as a model reaction since it readily occurs at ambient conditions on many transition metal catalysts. Platinum is one of the most active metals for this reaction while the activity of metallic cobalt is approximately two orders of magnitude lower. Pure CoO hollow nanocrystals are inactive for ethylene hydrogenation even following a 1 h $H_2$ pre-reduction at 373 K. Only upon reduction at 473 K for 1 h is ethane detected at temperatures >300 K. However, in accordance with one embodiment of the present invention samples containing Pt are active for $C_2H_4$ hydrogenation at temperatures as low as 208 K, with samples subjected to no pretreatment. The steady state turnover frequency for ethane formation at 227 K is $8.3 \times 10^{-3}$ $s^{-1}$, which is comparable to rate of $3.5 \times 10^{-2}$ $s^{-1}$ measured on a 0.04% Pt/$SiO_2$ catalyst. Comparison of reaction rates (on per gram total catalyst basis) at 300 K demonstrate that Pt@CoO is 2 orders of magnitude more active than CoO. These observations indicate that the reaction is catalyzed by Pt particles, not the CoO shell. This also confirms that a route exists for ethylene and hydrogen entry into the CoO shell interior. While not wishing to be bound by any particular theory or principle, the grain boundaries on the shell are the most probable entry points for ethylene and hydrogen diffusion into as well as ethane diffusion out of the shell.

For the hydrogenation of ethylene ($C_2H_4$) catalyzed by Pt/CoO nanocatalysts, the measurements were carried out in a gas handling manifold/atmospheric plug flow reactor (PFR) constructed of ¼" O.D. pyrex tubing. Gas flow rates were controlled with mass flow controllers (MKS Instruments) and all gases (He, $H_2$ and $C_2H_4$) were released into a central ⅛" O.D. stainless steel manifold connected to the pyrex manifold. The plug flow reactor was a U-tube of ¼" O.D. pyrex tubing with a porous pyrex frit for catalyst support. A thermocouple sheath made of ⅛" I.D. pyrex was inserted into the reactor for catalyst bed temperature measurements during reaction using a thermocouple (Omega Engineering Inc., Type K, ⅛" diameter). All ethylene hydrogenation reactions were conducted at sub-ambient conditions using organic solvent/liquid nitrogen slush baths, see Rondeau, R. E. *J. Chem. Eng. Data* 11, 124 (1966), the contents of which are hereby incorporated by reference in its entirety for all purposes. After stabilization of the slush bath temperature, the reactor was submersed in the bath. Reaction products were detected with a gas chromatograph (Hewlett Packard 5890 Series A) equipped with a flame ionization detector (FID). Reactants and products were separated with a homemade $Al_2O_3$ column (⅛" O.D. stainless steel tubing, 10 foot coiled length). Ethylene and ethane concentrations are determined from the area counts from the GC after Dietz correction, see Dietz, W. A. *J. Gas Chrom.* 5, 68 (1967). Typical reaction conditions were 10 Torr $C_2H_4$, 150 Torr $H_2$ with balance He at a total flowrate of 90 $cm^3$(STP) $min^{-1}$. A gas chromatograph from the hydrogenation of ethylene over a 14.2% Pt (5.4 nm)/CoO material at room temperature shows the peak with a retention time of 2.9 minutes is ethane, while the larger peak at 4.0 minutes is ethylene. In a typical experiment, approximately 25-100 mg of sample was loaded into the reactor and purged with 50 $cm^3$(STP) $min^{-1}$ He for 1 h followed by a 20%. $H_2$/He mixture (88.5 $cm^3$(STP) $min^{-1}$ total) for ½ h, after which the ethylene flow (1.5 $cm^3$(STP) $min^{-1}$) was started Pt containing CoO nanocrystals (nanoreactors) were characterized using physical adsorption measurements of nitrogen ($N_2$) at −195° C. (77 K). Total surface area, pore volume and pore size distribution were determined using an automated sorption analyzer (Quantachrome 1C). The total surface area was determined using the BET method, see S. Brunauer, P. Emmett, E. Teller, *J. Am. Chem. Soc.* 60, 309 (1938), the contents of which are hereby incorporated by reference in its entirety. The total pore volume was determined with the Kelvin equation using the $N_2$ uptake (at STP) at a relative pressure (P/$P_0$) of 0.975. Pore size distributions were determined by the Barrett-Joyner-Halenda (BJH) method, see E. P. Barrett, L. G. Joyner, P. P. Halenda, *J. Am. Chem. Soc.* 73, 373 (1951), the contents of which are hereby incorporated by reference in its entirety for all purposes.

Average Pt particle sizes were determined from counting particles in representative TEM micrographs (FIG. 1A). The method used has been described by Matyi et al., see Matyi, R. J.; Schwartz, L. H.; Butt, J. B. *Catal. Rev. Sci Eng.* 29, 41 (1987), the contents of which are hereby incorporated by reference in its entirety. TEM measurements of particle size represent a bulk measurement of particle size. The number of surface atoms, which is related to the bulk particle size was determined from the expression, $D=1.13/d$, where D is the dispersion (ratio of surface Pt atoms to the total number of Pt atoms) and d is the diameter of the nanoparticle in nm, see Yin, Y.; Rioux, R. M.; Erdonmez, C. K.; Hughes, S.; Somorjai, G. A.; Alivisatos, A. P. *Science* 304, 711 (2004), the contents of which are hereby incorporated by reference in its entirety. Determination of the number of surface Pt atoms enables catalytic rates (measured on a per gram total catalyst basis) to be normalized per mole of surface platinum, i.e. turnover frequency.

The adsorption/desorption isotherms of Pt/CoO nanoreactors were of type IV with type H2 hysteresis. The BET surface area of the Pt/CoO nonreactors varied from 3.0-100 $m^2g^{-1}$. For example, a 14.2% Pt (5.4 nm)/CoO had a total surface area of 65 $m^2g^{-1}$. The pore volume for the same 14.2% Pt/CoO catalyst was $6.8 \times 10^{-2}$ $cm^3$(STP)$g^{-1}$ at a P/$P_0$=0.975, while the BJH pore size was 3.6 nm.

EXAMPLES

Example 1

Synthesis of Pt@$Co_9S_8$ Nanoreactors

Pt was provided by preparing platinum nanoparticles by injecting a solution of 0.15 g of platinum acetylacetonate in 5 ml of o-dichlorobenzene into a refluxing bath of 10 ml of o-dichlorobenzene containing 0.3 g of 1,2-hexadecanediol, 0.1 ml of oleic acid, 0.1 ml of oleylamine and 0.06 ml of trioctylphosphine. The solution was then heated for another 120 minutes to yield Pt nanoparticles in solution. Pt@$Co_9S_8$ nanoreactors are formed by injecting 1.08 g $Co_2(CO)_8$ in 6 ml o-dichlorobenzene into the platinum nanocrystal solution followed by the sulfidation of the product particles by injecting a solution of 0.171 g sulfur in 10 ml of o-dichlorobenzene. The system was kept at the same temperature under stirring for 3 minutes. A black stable colloidal dispersion in o-dichlorobenzene is obtained. Finally, the Pt@$Co_9S_8$ nanoreactors are precipitated by methanol, washed with toluene and methanol three times, and dried under vacuum. Nitrogen adsorption/desorption measurement on the powder at 77K shows a type IV isotherm with type H2 hysteresis, with a Brunauer-Emmet-Teller (BET) surface area of 90 m$^2$/g.

Example 2

Synthesis of Pt@Co$_3$S$_4$ Nanoreactors

Platinum nanoparticles are prepared by injecting a solution of 0.15 g of platinum acetylacetonate in 5 ml of o-dichlorobenzene into a refluxing bath of 10 ml of o-dichlorobenzene containing 0.3 g of 1,2-hexadecanediol, 0.1 ml of oleic acid, 0.1 ml of oleylamine and 0.06 ml of trioctylphosphine. The solution was then heated for another 120 minutes. Pt@Co$_3$S$_4$ nanostructures are formed by injecting 1.08 g Co$_2$(CO)$_8$ in 6 ml o-dichlorobenzene into the platinum nanoparticle solution followed by the sulfidation of the product particles by injecting a solution of 0.256 g sulfur in 10 ml of o-dichlorobenzene. The system was kept at the same temperature under stirring for 3 minutes. A black stable colloidal dispersion in o-dichlorobenzene is obtained. Finally, the Pt@Co$_3$S$_4$ particles are precipitated by methanol, washed with toluene and methanol three times, and dried under vacuum. Nitrogen adsorption/desorption measurement on the powder at 77K shows a type IV isotherm with type H2 hysteresis, with a Brunauer-Emmet-Teller (BET) surface area of 90 m$^2$/g.

Example 3

Synthesis of Pt@CoO Nanoreactors

Platinum nanoparticles are prepared by injecting a solution of 0.15 g of platinum acetylacetonate in 5 ml of o-dichlorobenzene into a refluxing bath of 10 ml of o-dichlorobenzene containing 0.3 g of 1,2-hexadecanediol, 0.1 ml of oleic acid, 0.1 ml of oleylamine and 0.06 ml of trioctylphosphine. The solution was then heated for another 120 minutes. Pt@CoO nanostructures formed by injecting 1.08 g Co$_2$(CO)$_8$ in 6 ml o-dichlorobenzene into the platinum nanocrystals solution, and followed by the oxidation of the product particles by blowing a stream of O$_2$/Ar (1:4 in volume ratio, 120 ml/min) mixture into the colloidal solution at 455 K. The system was kept at the same temperature under stirring for 3 hours. A black stable colloidal dispersion in o-dichlorobenzene is obtained. Finally, the Pt@CoO nanoreactors are precipitated by methanol, washed with toluene and methanol three times, and dried under vacuum. Typical nitrogen adsorption/desorption measurement on the powder at 77K shows a type IV isotherm with type H2 hysteresis, with a Brunauer-Emmet-Teller (BET) surface area of 65 m$^2$/g.

Example 4

Catalytic Activity of Nanocatalysts

The Reactivity of 14.2% Pt (5.4 nm)/CoO Nanoparticles for ethylene hydrogenation A 14.2% Pt (5.4 nm) @CoO nanocatalyst was studied for catalytic ethylene hydrogenation reactivity. Approximately 25 mg of Pt/CoO nanocatalyst was loaded in a plug flow reactor and purged with 50 cm$^3$ (STP) min$^{-1}$ He for 1 h followed by a 20% H$_2$/He mixture (88.5 cm$^3$(STP) min$^{-1}$ total) for ½ h, after which ethylene flow (1.5 cm$^3$(STP) min$^{-1}$) was started. Upon contact of the ethylene and H$_2$ with the catalyst bed, a sharp exotherm was measured by the thermocouple strategically placed in the catalyst bed. The corresponding ethylene conversion was 100%. This material maintained 100% ethylene conversion at room temperature for more than 24 hours. In order to measure reaction rates at conditions free of heat and mass transfer, the conversion and corresponding temperature increase due to reaction were decreased by submersion of the reactor in a sub-ambient temperature organic solvent-liquid nitrogen slush bath. Slush bath temperatures were varied from 208-260 K and maintained ±1 K by the frequent addition of liquid nitrogen. At these temperatures, conversions varied from 1.5-14% conversion. Reaction rates at 227 K were reported as specific activity ($\mu$mol g$_{cat}^{-1}$s$^{-1}$) and turnover frequencies (s$^{-1}$). Turnover frequencies were normalized to the number of surface Pt atoms assuming a particle size determined from TEM measurements and all Pt was accessible to ethylene and hydrogen. The most active Pt/CoO nanoreactor had an activity of 1.3 $\mu$mol g$^{-1}_{cat}$s$^{-1}$ and a turnover frequency of 8.3×10$^{-3}$ s$^{-1}$ at 10 Torr C$_2$H$_4$, 150 Torr H$_2$ and 227 K. The ability of these Pt nanocatalysts confirms that ethylene and hydrogen are able to penetrate the CoO shell structure and react on the surface of Pt. While not wishing to be bound by any particular theory or principle, the most likely points of entry for ethylene and H$_2$ into the interior are the grain boundaries present on the polycrystalline CoO shell.

Example 5

Reactivity of 4.2% Pt (3.8 nm)/CoO Nanocatalysts for Ethylene Hydrogenation

Similar to example 4, a nanoreactor material with slightly smaller Pt particles (ave. 3.8 nm) was tested for ethylene hydrogenation in a plug flow reactor. Approximately 25 mg of catalyst was loaded in a plug flow reactor and purged with 50 cm$^3$(STP) min$^{-1}$ He for 1 h followed by a 20% H$_2$/He mixture (88.5 cm$^3$(STP)min$^{-1}$ total) for ½ h, after which ethylene flow (1.5 cm$^3$(STP)min$^{-1}$) was started. Reaction rates were measured at sub ambient temperatures by means of liquid nitrogen slush baths. Temperatures were varied from 208-250 K. At these temperatures, conversions varied from 1-10%. The 14.2% Pt (3.8 nm)/CoO nanoreactor catalyst had a turnover frequency of 2×10$^{-3}$ s$^{-1}$ at 10 Torr C$_2$H$_4$, 150 Torr H$_2$ and 227 K.

Example 6

Synthesis of Pt@CoO Nanoreactors with Pt Nanoparticles of Well-Defined Shapes

The invention contemplates that any shaped particle is suitable for the nanoparticle disposed in the nanoreactor. Dual sectioned nanoparticles are also contemplated as well as particles comprising two or more elements, in sections or alloys. The addition of sacrificial metal ions leads to the anisotropic growth of host metals in solution. Pt nanoparticles of ~7 nm with well-defined shape have been synthesized by the addition of varying amounts of Ag ions to an ethylene glycol solution containing chloroplatinic acid (H$_2$PtCl$_6$.xH$_2$O) and poly(vinylpyrrolidone) (PVP), see Song, H.; Kim, F.; Connor, S.; Somorjai, G. A.; Yang, P. *J. Phys. Chem. B* 109, 188 (2005), the contents of which are hereby incorporated by reference in its entirety for all purposes. Incorporation of Pt nanoparticles of well-defined shape into Co$_9$S$_8$, Co$_3$S$_4$, or CoO nanoreactors follows examples 1-3. Modification of the shape controlled Pt nanoparticle synthesis from Song et al. is required for Pt@CoO yolk-shell formation. Pt nanoparticles synthesized by Song et al. are coated with PVP and therefore hydrophilic. Pt@CoO nanoreactors are synthesized in o-dichlorobenzene requiring Pt nanoparticles bound by hydrophobic reagents. PVP is replaced on the shape-controlled Pt particles by ligand exchange. Pt nanoparticles are precipitated from ethylene glycol with acetone, followed by precipitation in hexane after which the Pt particles are redispersed in ethylene glycol containing 50 equivalents of hexadecanethiol (HDT). This solution is refluxed (190° C.) overnight, followed by washing the HDT coated Pt particles with acetone and precipitation with hexane. Washing and precipitation after ligand exchange is repeated numerous times. Finally, the particles are dispersed in chloroform. Infrared spectroscopy of the exchanged particles demonstrates that >80% of the PVP is exchanged for the long alkyl chain thiol.

Comparative Example 1

Catalytic Activity of Hollow Nanocrystal Without Enclosed Nanoparticle

Hollow cobalt oxide (CoO) nanoparticles were tested for ethylene hydrogenation to determine the catalytic activity of hollow CoO nanocrystals. The reactions were conducted in a plug flow reactor at ambient temperature and higher with ~75 mg of hollow CoO nanoparticles. No ethane formation was measured at ambient conditions for unreduced and CoO hollow nanoparticles reduced at 100° C. (373 K) for 1 h. Upon reduction at 473 K in 1 atm $H_2$, CoO nanoparticles were active for ethylene hydrogenation at temperatures above room temperature. Catalyst activity was measured from 295-353 K. With 75 mg of catalyst, no measurable activity below 0° C. (273 K) was detectable by gas chromatography.

It is evident that the Pt containing CoO nanoreactor enables the catalytic hydrogenation to occur at much lower temperatures than with the hollow CoO nanoparticle. Samples containing platinum without pretreatment were active ethylene hydrogenation at temperatures as low as 208 K, while the CoO nanoparticles without pretreatment demonstrated no ethylene hydrogenation at room temperature. Only upon reduction at 473 K for 1 h. are the hollow CoO nanoparticles active for ethylene hydrogenation, see Yin, Y.; Rioux, R. M.; Erdonmez, C. K.; Hughes, S.; Somorjai, G. A.; Alivisatos, A. P. *Science* 304, 711 (2004), the contents of which are incorporated by reference for all purposes. Comparative example 1 demonstrates that the Pt nanoparticles are responsible for catalyzing the hydrogenation of ethylene at low temperatures (208 K) and verifies that the polycrystalline CoO shell allows the diffusion of reactants and products into and out of the core, respectively. While not wishing to be bound by any particular theory or principle the most likely entry and exit points to the Pt core are grain boundaries.

Comparative Example 2

Comparison of Activity of Nanoreactors with Prior Art Catalysts

A comparison of reactivity of Pt/CoO nanocatalysts with metal oxide supported Pt catalysts of the prior art for ethylene hydrogenation is shown in Table 1. The catalytic reactivity of the Pt/CoO nanocatalysts were compared with ethylene hydrogenation measurements made on a number of supported and unsupported Pt catalysts, see Grunes, J.; Zhu, J.; Anderson, E. A.; Somorjai, G. A. *J. Phys. Chem. B.* 106, 11463 (2002), Zaera, F.; Somorjai, G. A. *J. Am. Chem. Soc.* 106, 2288 (1984), Cortright, R. D.; Goddard, S. A.; Rekoske, J. E.; Dumesic, J. A. *J. Catal.* 127, 342 (1991), the contents of which are all incorporated by reference in their entirety for all purposes. All turnover frequencies were corrected to 10 Torr $C_2H_4$, 100 Torr $H_2$ and 298 K using reported activation energies and reaction orders for extrapolation. A comparison of the Pt nanoreactor materials with a number of Pt based catalysts (supported and unsupported) is compiled in Table 1.

TABLE 1

| Catalyst | Corrected Turnover frequency[a] ($s^{-1}$) | Apparent Activation Energy, $E_a$ (kcal $mol^{-1}$) |
|---|---|---|
| Pt nanoparticle array[b] | 14.4 | 10.2 |
| Pt(111) single crystal[c] | 9.3 | 10.8 |
| 0.04% Pt/SiO$_2$ (cabosil)[d] | 4.4 | 8.6 |
| Pt wire[d] | 2.7 | 8.6 |
| 14.2% Pt(5.4 nm)/CoO[e] | 0.3 | 5.0 |
| 14.2% Pt(3.8 nm)/CoO | 0.2 | 8.3 |

[a]Rates corrected to 10 Torr $C_2H_4$, 100 Torr $H_2$ and 298K
[b]Grunes, J.; Zhu, J.; Anderson, E. A.; Somorjai, G. A. J. Phys. Chem. B. 106, 11463 (2002)
[c]Zaera, F.; Somorjai, G. A. J. Am. Chem. Soc. 106, 2288 (1984).
[d]Cortright, R. D.; Goddard, S. A.; Rekoske, J. E.; Dumesic, J. A. J. Caral. 127, 342 (1991).
[e]Yin, Y.; Rioux, R. M.; Erdonmez, C. K.; Hughes, S.; Somorjai, G. A.; Alivisatos, A. P. Science 304, 711 (2004).

Table 1 demonstrates that the turnover frequency for ethane production at room temperature is one order of magnitude lower than the catalyst (0.04% Pt/SiO$_2$) with the most similar morphology, while the rate is approximately two orders of magnitude lower than the Pt nanoparticle array and single crystal. The above comparison assumes for the Pt/CoO nanoreactor catalyst that all Pt particles are accessible and their surfaces are clean.

The terms and expressions which have been employed herein are used as terms of description and not of limitation, and there is no intention in the use of such terms and expressions of excluding equivalents of the features shown and described, or portions thereof, it being recognized that various modifications are possible within the scope of the invention claimed. Moreover, any one or more features of any embodiment of the invention may be combined with any one or more other features of any other embodiment of the invention, without departing from the scope of the invention.

All patents, patent applications, and publications mentioned above are herein incorporated by reference in their entirety for all purposes. None of the patents, patent applications, and publications mentioned above are admitted to be prior art.

What is claimed is:

1. A nanoreactor, comprising:
    a nanoreactor shell having a thickness of at least 0.5 nm,
    said nanoreactor shell enveloping a space, wherein,
    said nanoreactor shell is not perfectly single crystalline, further comprising
    a nanoparticle disposed within the space, wherein the nanoreactor shell comprises a main group metal, transition metal, alkali metal, or alkaline earth metal.

2. The nanoreactor as claimed in claim 1, wherein:
    the shell thickness is between about 0.5 nm and 100 nm.

3. The nanoreactor as claimed in claim 2, wherein:
    the shell thickness is between about 2 nm and 80 nm.

4. The nanoreactor as claimed in claim 3, wherein:
    the shell thickness is between about 3 nm and 10 nm.

5. The nanoreactor as claimed in claim 1, wherein:
    the shell comprises a material selected from the group consisting of Pt, ZnS, ZnSe, ZnTe, ZnO, CoO, $Co_3O_4$, $Fe_2O_3$, FeP, $Fe_3O_4$, FeO, $TiO_2$, CdS, CdSe, CdTe, HgS, HgSe, HgTe, MgTe, GaN, GaP, GaAs, GaSb, InN, InP, InAs, InSb, AlAs, AlP, AlSb, AlS, $Co_9S_8$, $Co_3S_4$, CoSe, GaMnAs, GaInN and InAsN.

6. The nanoreactor as claimed in claim 1, wherein:
the shell comprises a material selected from the group consisting of $Co_9S_8$, $Co_3S_4$, CoO, $Co_3O_4$, CoSe, CdS, $Fe_2O_3$, CdSe and Pt.

7. The nanoreactor as claimed in claim 5, wherein:
the shape of the nanoreactor is spherical, tubular or disk.

8. The nanoreactor as claimed in claim 7, wherein:
the shape of the nanoreactor is spherical, and
the outside diameter is between about 1 nm and 1000 nm.

9. The nanoreactor as claimed in claim 8, wherein:
the outside diameter is between 1 nm and 500 nm.

10. The nanoreactor as claimed in claim 9, wherein:
the outside diameter is between 5 nm and 100 nm.

11. The nanoreactor as claimed in claim 10, wherein:
the outside diameter is between 10 nm and 50 nm.

12. The nanoreactor as claimed in claim 11, wherein:
the outside diameter is between 10 nm and 30 nm.

13. The nanoreactor as claimed in claim 7, wherein:
the nanoreactor shell has a disk shape, and
the outside diameter is between about 10 nm to about 200 nm.

14. The nanoreactor as claimed in claim 13, wherein:
the outside diameter is between about 10 nm and 100 nm.

15. The nanoreactor as claimed in claim 13, wherein:
the outside diameter is between about 25 nm and 50 nm.

16. The nanoreactor as claimed in claim 7, wherein:
the nanoreactor has a tubular shape, and
a length of the tubular shape is between about 30 nm to about 500 μm.

17. The nanoreactor as claimed in claim 16, wherein:
the length is between about 50 nm and 200 μm.

18. The nanoreactor as claimed in claim 17, wherein:
the length is between about 50 nm and 20 μm.

19. The nanoreactor as claimed in claim 1, wherein:
the nanoreactor shell comprises a binary or ternary compound, wherein said binary or ternary compound comprises a first material and a second material, wherein:
the first material comprises a material selected from the group consisting of Pt, Zn, Co, Fe, Ti, Cd, Hg, Mg, Ga, In, Al, Ni, Sn and Bi; and
the second material is selected from the group consisting of S, Se, O, P, N, F, Cl, I, Br, As and Sb.

20. The nanoreactor as claimed in claim 19, wherein:
the diffusion rate for the first material is different than the diffusion rate for the second material.

21. A method of catalyzing a reaction, comprising:
contacting one or more reactants with a nanoreactor, the nanoreactor comprising:
a nanoreactor shell having a thickness of at least 0.5 nm,
said nanoreactor shell enveloping a space, wherein,
said nanoreactor shell is not perfectly single crystalline, further comprising
a nanoparticle disposed within the space, wherein the nanoreactor shell comprises a main group metal, transition metal, alkali metal, or alkaline earth metal; and
producing one or more reaction products.

22. A method of hydrodesulfurization, comprising:
contacting a compound comprising a thiophene moiety with a nanoreactor, the nanoreactor comprising:
a nanoreactor shell having a thickness of at least 0.5 nm,
said nanoreactor shell enveloping a space, wherein,
said nanoreactor shell is not perfectly single crystalline, further comprising
a nanoparticle disposed within the space, wherein the nanoreactor shell comprises a main group metal, transition metal, alkali metal, or alkaline earth metal; and
producing one or more hydrodesulfurization products.

23. A method of making a nanoreactor, comprising
providing a nanoparticle,
coating the nanoparticle with a first material,
reacting the first material with a second material,
wherein the first and second material react to form a nanoreactor shell that envelopes a space within which the nanoparticle is disposed and comprises a main group metal, transition metal, alkali metal, or alkaline earth metal.

24. The method of making a nanoreactor as claimed in claim 23, wherein:
the first material comprises a material chosen from the group consisting of Al, Ga, In, Tl, Sn, Pb, Bi, Po, Sc, Ti, V, Cr, Mn, Fe, Co, Ni, Cu, Y, Zr, Nb, Mo, Tc, Ru, Rh, Pd, Ag, Cd, La, Hf, Ta, W, Re, Os, Ir, Pt, Au, Hg, Li, Na, K, Rb, Cs, Be, Mg, Ca, Sr, Ba, Ge, Si, Se, Te, FeCo, CoNi and CdZn.

25. The method of making a nanoreactor as claimed in claim 23, wherein:
the second material comprises a material chosen from the group consisting of S, O, Se, Te, P, N, As, Cl, I, Br and Bi.

26. The method of making a nanoreactor as claimed in claim 25, wherein:
the second material comprises a material chosen from the group consisting of S, O, Se and Te.

27. The method of making a nanoreactor as claimed in claim 23, wherein:
the second material comprises sulfur in solution, and
the second material is combined with a solution containing the first material to make a sulfide nanoreactor.

28. The method of making a nanoreactor as claimed in claim 23, wherein:
the second material comprises O, and
a gaseous mixture containing the second material is combined with a solution containing the first material,
thereby making an oxide nanoreactor compound.

29. The method of making a nanoreactor as claimed in claim 23, wherein:
the second material comprises O, and
and the second material is in solution and is combined with a solution containing the first material,
thereby making an oxide nanoreactor compound.

30. The nanoreactor as claimed in claim 1, wherein:
the nanoparticle comprises a material selected from the group consisting of Al, Ga, In, Tl, Sn, Pb, Bi, Po, Sc, Ti, V, Cr, Mn, Fe, Co, Ni, Cu, Y, Zr, Nb, Mo, Tc, Ru, Rh, Pd, Ag, Cd, La, Hf, Ta, W, Re, Os, Ir, Pt, Au, Hg, Li, Na, K, Rb, Cs, Be, Mg, Ca, Sr, Ba, Ge, Si, Se, and Te.

31. The nanoreactor as claimed in claim 30, wherein the nanoparticle comprises Pt.

* * * * *